US00RE43148E

(19) United States
(12) Reissued Patent
Fujisawa et al.

(10) Patent Number: US RE43,148 E
(45) Date of Reissued Patent: Jan. 31, 2012

(54) MOUNTING STRUCTURE AND MOUNTING METHOD OF A SEMICONDUCTOR DEVICE, AND LIQUID CRYSTAL DISPLAY DEVICE

(75) Inventors: Junichi Fujisawa, Musashino (JP); Mitsuyoshi Matsumura, Hachioji (JP)

(73) Assignee: Casio Computer Co., Ltd., Tokyo (JP)

(21) Appl. No.: 12/970,642

(22) Filed: Dec. 16, 2010

Related U.S. Patent Documents

Reissue of:
(64) Patent No.: 7,466,388
Issued: Dec. 16, 2008
Appl. No.: 11/375,279
Filed: Mar. 14, 2006

(30) Foreign Application Priority Data

Mar. 15, 2005 (JP) ..... 2005-073155

(51) Int. Cl.
*G02F 1/1345* (2006.01)
*G09G 3/36* (2006.01)

(52) U.S. Cl. ..... 349/149; 349/151; 349/152; 345/90

(58) Field of Classification Search ..... 349/149, 349/151, 152; 345/90
See application file for complete search history.

(56) References Cited

U.S. PATENT DOCUMENTS 5,748,179 A * 5/1998 Ito et al. ..... 349/152
7,466,388 B2 * 12/2008 Fujisawa et al. ..... 349/149
7,554,126 B2 * 6/2009 Higashi et al. ..... 257/79

FOREIGN PATENT DOCUMENTS

JP 9-80456 A 3/1997
JP 2004-214374 A 7/2004
KR 10-2001-0104667 A 11/2001

* cited by examiner

*Primary Examiner* — Mike Qi
(74) *Attorney, Agent, or Firm* — Holtz, Holtz, Goodman & Chick, PC

(57) ABSTRACT

A mounting structure of a semiconductor device includes an electroconductive film provided on a substrate. An insulating film is formed on the electroconductive film, and provided with an opening portion to expose a part of the electroconductive film, and its internal stress is set to serve as a compression stress. An anisotropic electroconductive binding material is disposed across the part of the electroconductive film exposed by the opening portion and the insulating film. A semiconductor device has a plurality of electrodes, and is disposed on the anisotropic electroconductive binding material. The electrodes are electrically connected with the electroconductive film through the anisotropic electroconductive binding material.

48 Claims, 6 Drawing Sheets

MOUNTING STRUCTURE AND MOUNTING METHOD OF A SEMICONDUCTOR DEVICE, AND LIQUID CRYSTAL DISPLAY DEVICE

Matter enclosed in heavy brackets [ ] appears in the original patent but forms no part of this reissue specification; matter printed in italics indicates the additions made by reissue.

CROSS-REFERENCE TO RELATED APPLICATIONS

This application is based upon and claims the benefit of priority from prior Japanese Patent Application No. 2005-073155, filed Mar. 15, 2005, the entire contents of which are incorporated herein by reference.

BACKGROUND OF THE INVENTION

1. Field of the Invention

The present invention relates to a mounting structure and a mounting method of a semiconductor device, and a liquid crystal display device.

2. Description of the Related Art

A liquid crystal display panel is constituted of a transistor array circuit substrate on which a plurality of thin film transistors, electrodes and others are formed in a matrix form, an opposed substrate, a sealing material which couples the two substrates to each other, and a liquid crystal which is injected between the substrates. A semiconductor device (a driver device) which drives the thin film transistors is attached to the transistor array circuit substrate.

As a method of manufacturing a circuit substrate such as a transistor array circuit substrate, there is a method described in, e.g., Jpn. Pat. Appln. KOKAI Publication No. 9-80456. Specifically, an electroconductive film is formed on a substrate, a patterning is made by a photolithography method and an etching method, and an insulating film is formed to cover the patterned film. This process is repeated.

An anisotropic electroconductive binding material is used for attachment of a semiconductor device such as an LSI chip on to a circuit substrate like a transistor array circuit substrate. This anisotropic electroconductive binding material is formed of a binder resin consisting of a thermosetting resin and electroconductive particles appropriately dispersed in the binder resin. The anisotropic electroconductive binding material is sandwiched between a terminal on the circuit substrate and an electrode of the semiconductor device, and the semiconductor device is pressed from above toward the circuit substrate side and heated by heating and pressing means such as a bonding device having heating means. Thus, the binder resin is spread so that at least one electroconductive particle is sandwiched between the opposed electrodes. As a result, a part between the terminal on the circuit substrate and the electrode of the semiconductor device can be electrically conducted. On the other hand, since the electroconductive particles are appropriately dispersed in the binder resin and the binder resin is an insulating material, the binder resin has insulation properties in a plane direction. As described above, when the anisotropic electroconductive binding material is sandwiched between the opposed substrates and the semiconductor device is thermally pressed against the circuit substrate by the heating and pressing means, the circuit substrate and the semiconductor device can be joined to each other and, at the same time, the part between the terminal of the circuit substrate and the electrode of the semiconductor substrate can be electrically conducted (U.S. Pat. No. 5,748,179).

Meanwhile, in case of attaching (mounting) a semiconductor device to a circuit substrate by using an anisotropic electroconductive binding material, the binding material is disposed in a range larger than a semiconductor device attachment region on the circuit substrate while considering a dimensional tolerance at the time of forming the anisotropic electroconductive binding material, an attachment tolerance of the anisotropic electroconductive binding material and an attachment tolerance of the semiconductor device. Further, in case of thermally pressing the semiconductor device against the circuit substrate by pressing the semiconductor device from above toward the circuit substrate side and heating the same with the anisotropic electroconductive binding material being sandwiched between opposed substrates, the semiconductor device is heated by heating and pressing means to conduct heat to the anisotropic electroconductive binding material.

At this time, heat is not conducted to a position apart from the semiconductor device, and a binding resin part at this position remains unhardened. Ionic impurities and/or moisture is apt to enter this unhardened position. When such moisture or the like further enters an insulating film, the moisture is stored in a wiring line portion and functions as an oxidizer with respect to a metal forming a wiring line. As a result, such moisture can be a factor of corrosion by which a surface of the metal is ionized and lost, and this corrosion may further grow to result in disconnection. Furthermore, the insulating film tends to be strained at a boundary between a part to which heat or pressure for thermocompression is applied and an outer peripheral part to which heat or pressure is not applied, and moisture or the like readily enters this part. Therefore, a wiring line pattern below the insulating film at the boundary portion is apt to corrode.

Moreover, in recent years, miniaturization and high-definition have been demanded in a liquid crystal display panel. Therefore, the number of thin film transistors formed per unit area in a display region on a substrate has been increased. With this increase, the number of gate lines and drain lines connected with respective thin film transistors per unit area is also increased, and the number of many pulled-out wiring lines respectively connected with these gate lines and drain lines per unit area is also increased, which leads to a reduction in intervals of the pulled-out wiring lines. On the other hand, in order to reduce an area of a region in which the semiconductor device which drives gate lines or drain lines is mounted outside a display region on the substrate, one semiconductor device which can drive both gate electrodes and drain electrodes of the thin film transistors may be mounted in some cases (realization of a one-chip drive circuit). In a liquid crystal display panel in which intervals between the pulled-out wiring lines are narrowed and the one-chip drive circuit is adopted in this manner, the present inventors have confirmed that the above-described corrosion of the wiring lines is particularly apt to be generated. Such a problem is also confirmed in not only a transistor array circuit substrate including thin film transistors but also a passive matrix type circuit substrate and a display device including the passive matrix type circuit substrate.

BRIEF SUMMARY OF THE INVENTION

It is an object of the present invention to provide a circuit substrate which can suppress the generation of corrosion in a wiring line pattern of the circuit substrate when an electronic component such as a semiconductor device is thermally compressed on the circuit substrate by using an anisotropic electroconductive binding material and can constrain disconnection generated as a result of growth of corrosion, a mounting method of a semiconductor device with respect to the circuit substrate, and a liquid crystal display device including the circuit substrate.

According to a first aspect of the present invention, there is provided a mounting structure of a semiconductor device, comprising:

a substrate;

an electroconductive film provided on the substrate;

an insulating film which is formed on the electroconductive film and which is provided with an opening portion to expose a part of the electroconductive film and whose internal stress is set to be a compression stress;

an anisotropic electroconductive binding material which is disposed on the part of the electroconductive film exposed by the opening portion and on the insulating film; and a semiconductor device which has a plurality of electrodes and is disposed on the anisotropic electroconductive binding material, the plurality of electrodes being electrically connected with the electroconductive film through the anisotropic electroconductive binding material.

According to a second aspect of the present invention, there is provided a mounting method of a semiconductor device, comprising:

preparing a substrate on which an electroconductive film, an insulating film and an anisotropic electroconductive binding material are provided, the insulating film being formed on the electroconductive film and being provided with an opening portion to expose a part of the electroconductive film therefrom and having an internal stress set to be a compression stress, the anisotropic electroconductive binding material being disposed on the part of the electroconductive film exposed by the opening portion and on the insulating film; and disposing a semiconductor device having a plurality of electrodes on the anisotropic electroconductive binding material, thereby electrically connecting the plurality of electrodes with the electroconductive film through the anisotropic electroconductive binding material.

According to a third aspect of the present invention, there is provided a liquid crystal display device comprising:

a pair of substrates;

an electroconductive film provided on one of the pair of substrates;

an insulating film which is formed on the electroconductive film and which is provided with an opening portion to expose a part of the electroconductive film therefrom and whose internal stress is set to be a compression stress;

an anisotropic electroconductive binding material which is disposed on the part of the electroconductive film exposed by the opening portion and on the insulating film; and a semiconductor device which has a plurality of electrodes and is disposed on the anisotropic electroconductive binding material, the plurality of electrodes being electrically connected with the electroconductive film through the anisotropic electroconductive binding material.

DETAILED DESCRIPTION OF THE INVENTION

The best mode for carrying out the present invention will now be described hereinafter with reference to the accompanying drawings. However, various restrictions which are technically preferable for carrying out the present invention are put with respect to the following embodiment, but a scope of the present invention is not limited to the following embodiments and illustrated examples.

Figure 1:
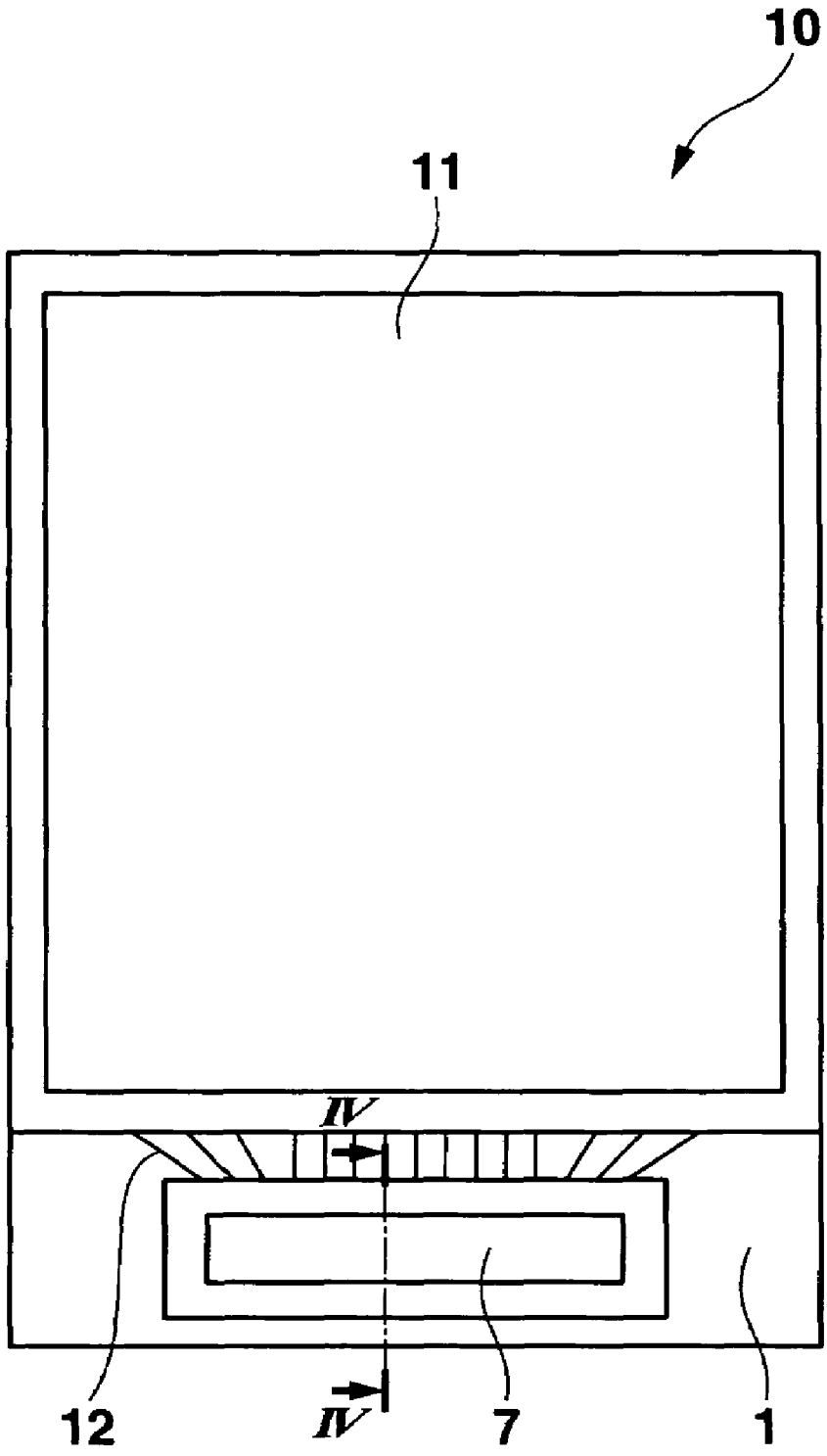
FIG. 1 is a plan view showing a liquid crystal display panel according to an embodiment of the present invention.

FIG. 1 is a plan view of a liquid crystal display panel 10 to which the present invention is applied. The liquid crystal display panel 10 is constituted of a transistor array circuit substrate 1, an opposed substrate 11, a rectangular frame-like seal (not shown) which attaches the two substrates to each other, a semiconductor device 7 and others.

Figure 2:
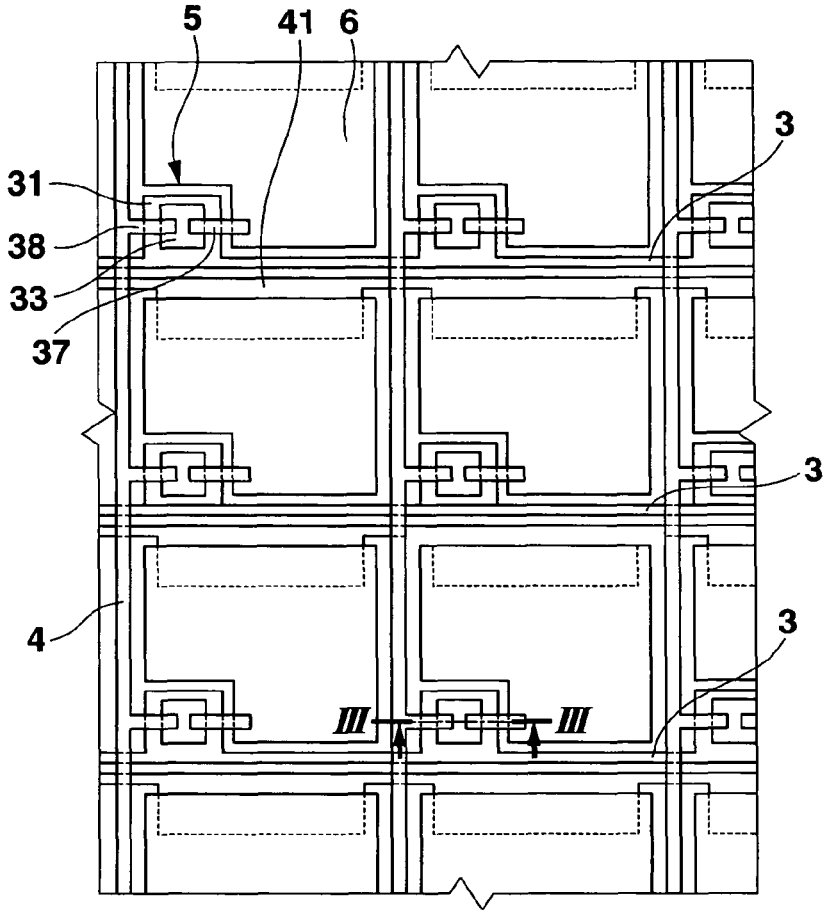
FIG. 2 is a plan view showing a part of a pixel region of a transistor array circuit substrate in the liquid crystal display panel.
Figure 3:
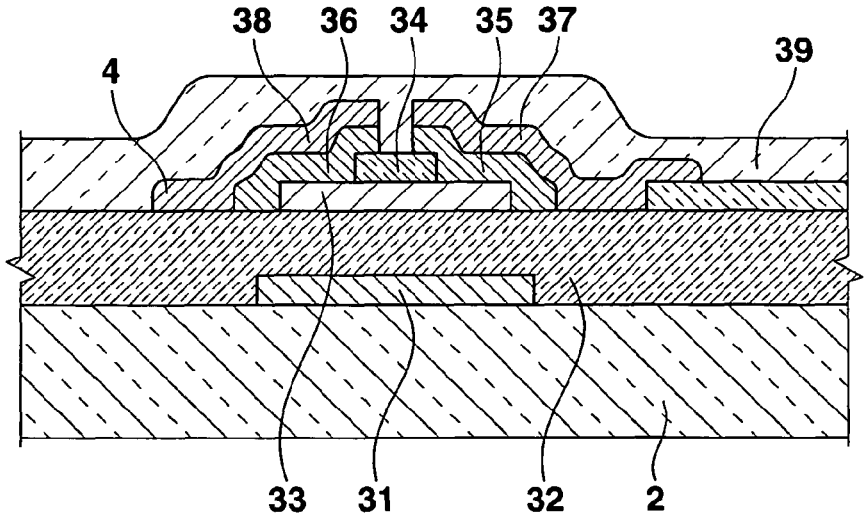
FIG. 3 is a cross-sectional view of a plane taken along a cutting-plane line III-III in FIG. 2.

FIG. 2 is a plan view showing a part of a display region of the transistor array circuit substrate 1. FIG. 3 is a cross-sectional view of a plane taken along a cutting-plane line III-III in FIG. 2. As shown in FIG. 2, a plurality of gate lines (scanning lines) 3 extending in a row direction on an insulative transparent substrate 2 and a plurality of drain lines (signal lines) 4 extending in a column direction are formed on a part of the transistor array circuit substrate 1 which is superimposed on the opposed substrate 11. These gate lines 3 and drain lines 4 are electrically connected with the semiconductor device 7 through pulled-out wiring lines 12 (see FIG. 1).

Figure 4:
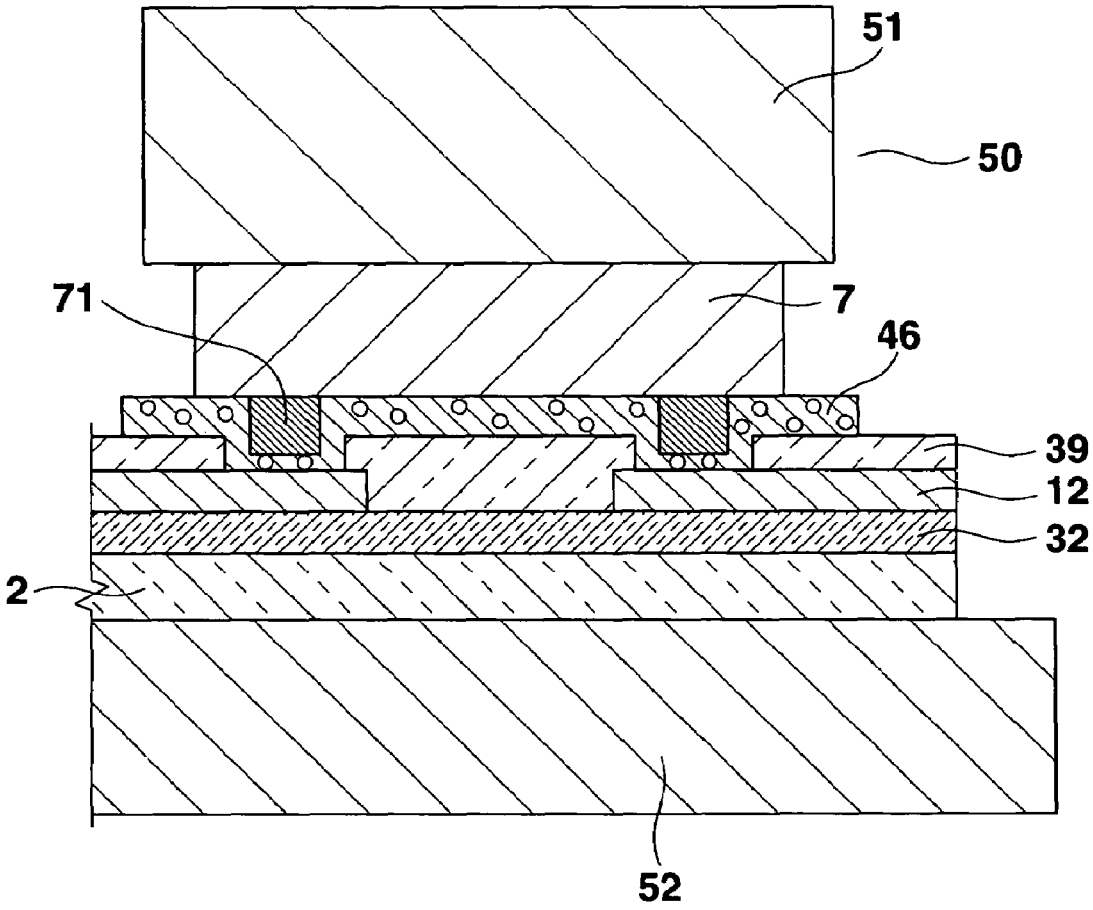
FIG. 4 is a cross-sectional view of a plane taken along a cutting-plane line IV-IV in FIG. 1.

FIG. 4 is a cross-sectional view of a plane taken along a cutting-plane line IV-IV in FIG. 1. It is to be noted that FIG. 4 also shows a state of a head 51 included in heating and pressing means 50 (not shown in FIG. 1) when the semiconductor device 7 mounted on a pedestal 52 is pressed and heated by the heating and pressing means 50.

The gate lines 3 and the drain lines 4 are insulated from each other, and the gate lines 3 and the drain liens 4 are orthogonal to each other as seen from a plane. Further, a plurality of thin film transistors 5 are arranged in a matrix form on the insulative transparent substrate 2, and each thin film transistor 5 is electrically connected with the gate line 3 and the drain line 4 at each intersection of the gate and drain lines 3, 4. Each pixel electrode 6 electrically connected with the thin film transistor 5 is disposed in each surrounded region surrounded by the gate line 3 and the drain line 4. The plurality of pixel electrodes 6 are arranged in a matrix form on the insulative transparent substrate 2, thereby forming a display region.

Each of all the thin film transistors 5 is configured as shown in FIG. 3. As shown in FIG. 3, the thin film transistor 5 is constituted of a gate electrode 31 electrically connected with the gate line 3, a semiconductor film 33 disposed to face the gate electrode 31 with a gate insulating film 32 therebetween, a channel protection film 34 formed on a central part of the semiconductor film 33, impurity doped semiconductor films 35 and 36 which are disposed on both sides of the channel protection film 34 as seen from the plane and formed on the semiconductor film 33 to be apart from each other, a source electrode 37 formed on one impurity doped semiconductor film 35, and a drain electrode 38 formed on the other impurity doped semiconductor film 36.

The gate electrode 31 is formed of a metal material having a low resistivity, e.g., an electroconductive material such as an alloy. More preferably, it is good enough for the gate electrode 31 to have a light blocking effect like chrome, a chrome alloy, aluminum, an aluminum alloy or the like.

The gate insulating film 32 is obtained by thickly forming an insulating material such as silicon oxide or silicon nitride on the insulative transparent substrate 2.

The semiconductor film 33 is formed of amorphous silicon or polysilicon.

Each of the impurity doped semiconductor films 35, 36 is obtained by doping an impurity (e.g., Ga) in a semiconductor such as silicon.

The channel protection film 34 is formed of an insulating material such as silicon oxide or silicon nitride, and protects the semiconductor film 33 from an etchant when performing patterning with respect to the impurity doped semiconductor films 35, 36.

Each of the source electrode 37 and the drain electrode 38 is formed of a metal material having a low resistivity, e.g., an electroconductive material such as an alloy. More preferably, it is good enough for each of the source electrode 37 and the drain electrode 38 to have a light blocking effect like chrome, a chrome alloy, aluminum, an aluminum alloy or the like.

These thin film transistors 5 are covered with a protection insulating film 39. The protection insulating film 39 is formed by thickly forming an insulating material such as silicon oxide or silicon nitride on a surface, and collectively covers the plurality of thin film transistors 5.

As shown in FIG. 2, the gate electrodes 31 of the plurality of thin film transistors 5 disposed in respective columns in the row direction are integrally formed with the common gate line 3. Any gate electrode 31 and any gate line 3 are formed by patterning the electroconductive film thickly formed on the insulative transparent substrate 2 (this electroconductive film will be referred to as a gate film hereinafter).

As shown in FIGS. 2 and 3, the drain electrodes 38 of the plurality of thin film transistors 5 arranged in the respective columns in the column direction are integrally formed with the common drain line 4. Any drain electrode 38, any source electrode 37 and any drain line 4 are formed by patterning the electroconductive film thickly formed on one surface (this electroconductive film will be referred to as a drain film hereinafter) to cover the impurity doped semiconductor films 35, 36.

As shown in FIG. 1, the plurality of pixel electrodes 6 are arranged in the matrix form on the gate insulating film 32. These pixel electrodes 6 are formed by patterning the transparent electroconductive film thickly formed on the gate insulating film 32. The pixel electrode 6 has light permeability, and is formed of indium oxide, tin oxide or a mixture containing at least one of these materials (e.g., ITO, zinc-doped indium oxide or CTO). These pixel electrodes 6 are also collectively covered with the protection insulating film 39.

The protection insulating film 39 is obtained by thickly forming an insulating material such as silicon oxide or silicon nitride on one surface, and collectively covers the plurality of thin film transistors 5. The protection insulating film 39 is formed in such a manner that its internal stress is a compression stress.

As shown in FIG. 2, each capacitor line 41 extends in the row direction between the gate lines 3 adjacent to each other, and the gate lines 3 and the capacitor lines 41 are alternately disposed. These capacitor lines 41 are patterned simultaneously with the gate electrodes 31 and the gate lines 3 by patterning of the gate film. Further, each capacitor line 41 is provided with a large width to overlap each of the plurality of pixel electrodes 6 arranged in the respective columns in the row direction. The large width part of the capacitor line 41 faces the pixel electrode 6 with the gate insulating film 32 therebetween, thereby forming a capacitor. Each capacitor line 41 is grounded to a short-circuit wiring line (not shown) formed to surround the display region.

The rectangular frame-like seal (not shown) is formed on the protection insulating film 39 to surround the display region. This seal seals a liquid crystal injected between the transistor array circuit substrate 1 and the opposed substrate 11 when the transistor array circuit substrate 1 faces the opposed substrate 11. When the liquid crystal is sealed between the transistor array circuit substrate 1 and the opposed substrate 11 in this manner, the pixel region of the liquid crystal display panel 10 is constituted. It is to be noted that a color filter, a black matrix, a transparent opposed electrode, an alignment film and others are formed on the opposed substrate 11.

Figure 7:
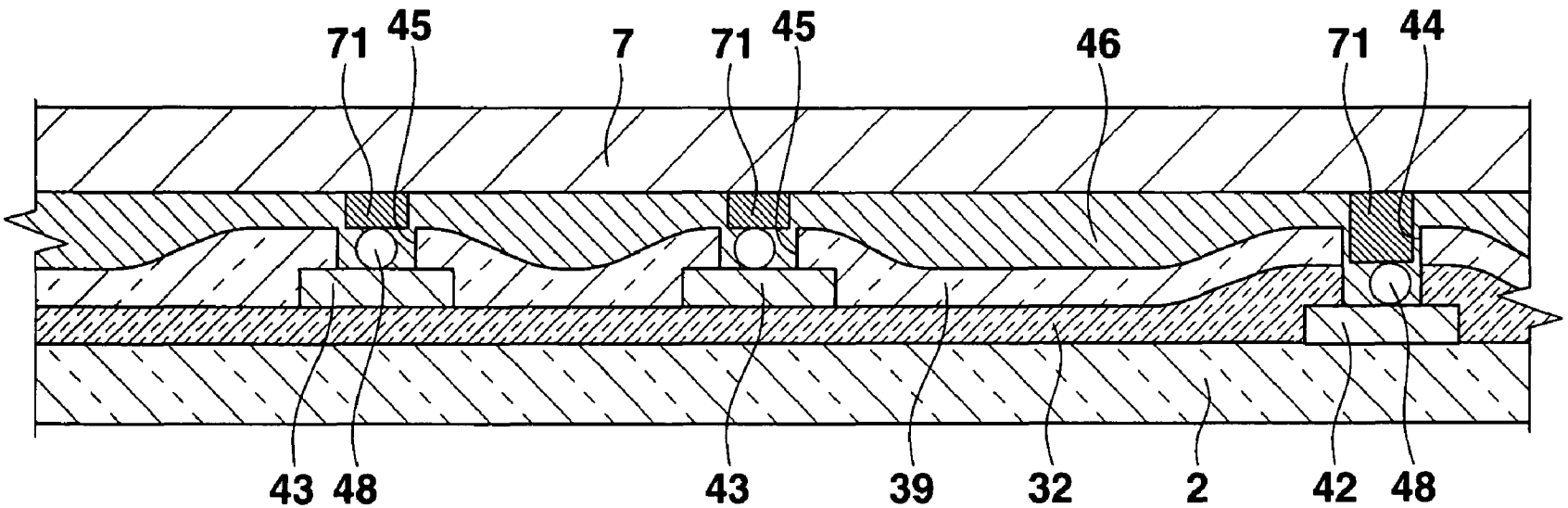
FIG. 7 is a cross-sectional view of a plane taken along a cutting-plane line VII-VII in FIG. 5.

A driver device which drives the thin film transistors 5 is included in the semiconductor device 7, and the semiconductor device 7 has electrodes 71 connected with a gate terminal 42 and a drain terminal 43 in a lower portion thereof, as shown in FIG. 7. The semiconductor device 7 is thermally pressed in a driver attachment (mounting) region of the transistor array circuit substrate 1 by heating and pressing means 50 such as a bonding device through an anisotropic electroconductive binding material 46 as shown in FIG. 4.

Figure 5:
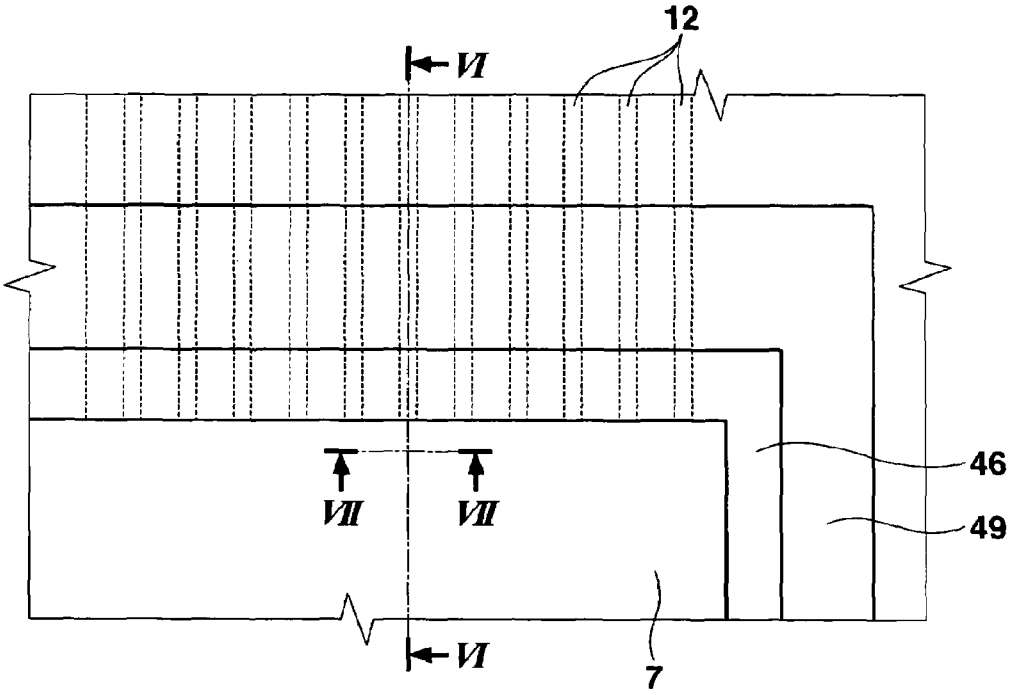
FIG. 5 is a plan view showing a driver attachment region on the transistor array circuit substrate.
Figure 6:
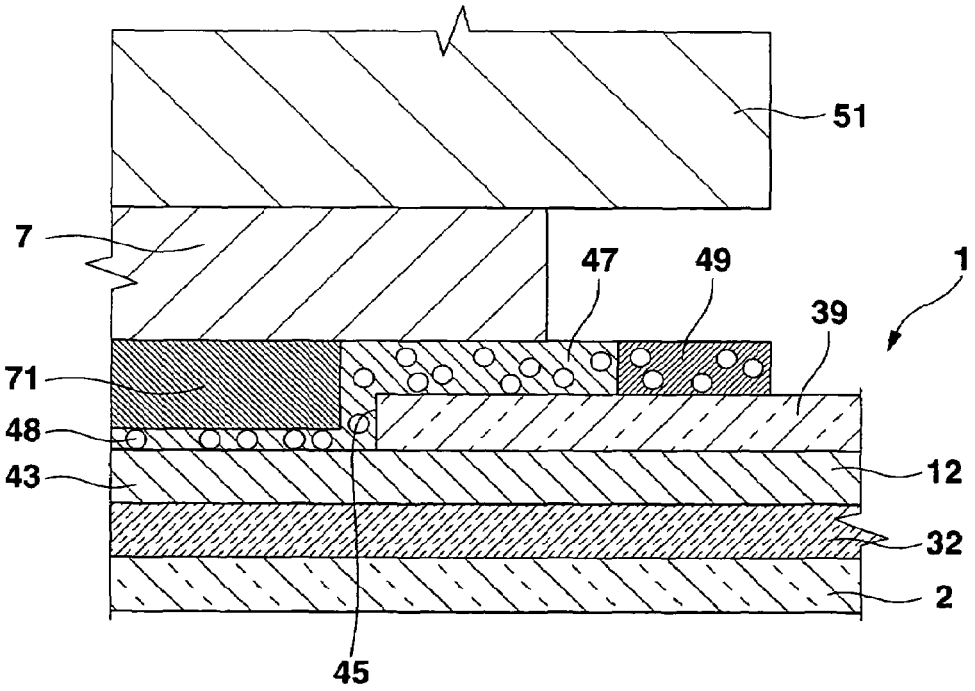
FIG. 6 is a cross-sectional view of a plane taken along a cutting-plane line VI-VI in FIG. 5.

FIG. 5 is a plan view showing the driver attachment region of the transistor array circuit substrate 1, FIG. 6 is a cross-sectional view of a plane taken along a cutting-plane line VI-VI in FIG. 5, and FIG. 7 is a cross-sectional view of a plane taken along a cutting-plane line VII-VII in FIG. 5. A plurality of gate terminals 42 and a plurality of drain terminals 43 are disposed in the driver attachment region. It is to be noted that FIG. 6 also shows a state of a head 51 (not shown in FIG. 5) when pressing and heating the semiconductor device 7.

Each gate terminal 42 is connected with any of the plurality of gate lines 3 in a one-on-one relationship by a pulled-out wiring line 12. Furthermore, each drain terminal 43 is connected with any of the plurality of drain lines 4 in a one-on-one relationship by the pulled-out wiring line 12. The plurality of pulled-out wiring lines 12 which connect the gate terminals 42 with the plurality of gate lines 3 and the plurality of gate terminals 42 are formed by patterning the gate film. Moreover, the plurality of pulled-out wiring lines 12 which connect the plurality of drain terminals 43 with the plurality of drain lines 4. The drain terminals 43 are formed by patterning the drain film.

As shown in FIG. 7, a contact hole (another opening portion) 44 is formed in parts of the gate insulating film 32 and the protection insulating film 39 which cover the gate terminal 42 in order to expose the gate terminal 42. Additionally, a contact hole (an opening portion) 45 from which the drain terminal 43 is exposed is formed in the protection insulating film 39 which covers the drain terminal 43. Each electrode 71 of the semiconductor device 7 is inserted into each of the contact holes 44 and 45 with the anisotropic electroconductive binding material 46 therebetween.

The anisotropic electroconductive binding material 46 is provided to cover the driver attachment region. As shown in FIG. 6, the anisotropic electroconductive binding material 46 is formed of a binder resin 47 consisting of a thermosetting resin and electroconductive particles 48 appropriately dispersed in the binder resin 47. As shown in this figure, at least one electroconductive particle 48 is sandwiched between the gate terminal 42 or the drain terminal 43 and the electrode of the semiconductor device 7. As shown in FIGS. 6 and 7, the electrode of the semiconductor device 7 holds the electroconductive particle 48 between itself and the gate terminal 42 or the drain terminal 43 immediately below this electrode, and is electrically conducted through this electroconductive particle 48. On the other hand, since the binder resin 47 is an insulating material, the electrode and any other gate terminal 42 or drain terminal 43 are insulated by the binder resin 47.

A manufacturing method of the transistor array circuit substrate 1 will now be described.

First, the gate film is thickly formed on the insulative transparent substrate 2 by a vapor growth method (a sputtering method, a CVD method, a PVD method or the like), and the gate film is patterned by a photolithography method and an etching method. As a result, the plurality of gate lines 3, the gate electrodes 31 of the plurality of thin film transistors 5, the plurality of capacitor lines 41, the plurality of pulled-out wiring lines 12, the gate terminals 42 and the short-circuit wiring line are simultaneously formed.

Then, the gate insulating film 32 is thickly formed on the insulative transparent substrate 2 by the vapor growth method so that the plurality of gate lines 3, the gate electrodes 31 of the plurality of thin film transistors 5, the plurality of capacitor lines 41, the plurality of pulled-out wiring lines 12 and the short-circuit wiring line are covered with the gate insulating film 32.

Subsequently, a semiconductor film is thickly formed on the gate insulating film 32 by the vapor growth method, and this semiconductor film is patterned by the photolithography method and the etching method. As a result, the semiconductor films 33 of the plurality of thin film transistors 5 are formed.

Then, the vapor growth method, the photolithography method and the etching method are sequentially repeatedly performed to sequentially form the channel protection films 34 of the plurality of thin film transistors 5, the impurity semiconductor films 35 and 36 and the pixel electrodes 6.

Subsequently, a drain film is thickly formed on the gate insulating film 32 by the vapor growth method. Thereafter, the drain film is patterned by the photolithography method and the etching method. As a result, the plurality of drain lines 4, the drain electrode 38 and the source electrode 37 of each of the plurality of thin film transistors 5, the plurality of pulled-out wiring lines 12, the drain terminal 43 and the short-circuit wiring line are simultaneously formed.

Then, the protection insulating film 39 is thickly formed on the gate insulating film 32 by the vapor growth method so that the plurality of drain lines 4, the drain electrode 38 and the source electrode 37 of each of the plurality of thin film transistors 5, the plurality of pulled-out wiring lines 12 and the short-circuit wiring line are covered with the protection insulating film 39 whose internal stress is a compression stress.

Here, when, e.g., a silicon nitride film is formed as the protection insulating film 39 whose internal stress is a compression stress, silane and ammonia are provided as reactive gases, nitrogen is provided as a carrier gas, and film formation can be performed by a plasma CVD method under conditions that a temperature in film formation is 250° C. and a pressure is not greater than 125 Pa. The protection insulating film 39 whose internal stress is a compression stress is not restricted to a silicon nitride film, and the other insulating film such as a silicon oxide film may be also used. Additionally, a film formation method of the protection insulating film 39 is not restricted to a CVD method, and the other film formation method such as a PVD method or any other vapor deposition method may be used for film formation.

An alignment film is formed on the manufactured transistor array circuit substrate 1, the transistor array circuit substrate 1 is set to face the opposed substrate 11, a liquid crystal is injected between the transistor array circuit substrate 1 and the opposed substrate 11, and then the liquid crystal is sealed by using the seal.

Then, the contact holes 44 and 45 are formed at positions in the gate insulating film 32 and the protection insulating film 39 where the electrodes 71 of the semiconductor device 7 are disposed so that each pulled-out wiring line 12 is exposed. Subsequently, the driver attachment region is covered with the anisotropic electroconductive binding material 46, and the semiconductor device 7 is disposed on the anisotropic electroconductive binding material 46 in such a manner that the electrodes 71 are inserted in the contact holes 44 and 45.

Then, the head 51 of the heating and pressing means 50 is brought into contact with an upper surface of the semiconductor device 7, the semiconductor device 7 is pressed from above toward the circuit substrate side while being heated, and the binder resin 47 is thermally hardened by heat conduction from the semiconductor device 7. As a result, the semiconductor device 7 is fixed on the transistor array circuit substrate, and the gate terminals 42 and the drain terminals 43 connected with the respective pulled-out wiring lines 12 are connected with the respective electrodes of the semiconductor device 7 through the electroconductive particles 48, thereby bringing the liquid crystal display panel 10 to completion.

At this time, as shown in FIG. 6, since an amount of heat sufficient to thermally harden the binder resin 47 is not conducted to a part of the anisotropic electroconductive binding material apart from the semiconductor device 7, an unhardened region 49 where the binder resin 47 is unhardened remains. In a conventional transistor array circuit substrate, corrosion and/or disconnection is generated in the pulled-out wiring line below the protection insulating film corresponding to the unhardened region. As a factor causing such corrosion and/or disconnection, there is a fact that an internal stress of a conventional protection insulating film functions as a tensile stress. Ionic impurities and/or moisture is apt to enter the unhardened region of the binder resin as compared with a heat-hardened region, and such moisture or the like reaches an upper surface of the protection insulating film corresponding to the unhardened region. Here, when the internal stress of the protection insulating film is a tensile stress, a film density is low, and hence such moisture or the like is apt to enter the protection insulating film. There can be considered that such infiltrated moisture or the like is stored in the vicinity of the pulled-out wiring lines formed below the protection insulating film to cause corrosion, and corrosion further grows to result in disconnection. Furthermore, heat and a pressure are applied to a part of the protection insulating film corresponding to a semiconductor device attachment region, strain is produced between this part and an outer peripheral part to which heat or a pressure is not applied, and the protection insulating film is damaged. Therefore, moisture or the like is particularly apt to enter a part in the vicinity of a boundary between the unhardened region and the heat-hardened region and corrosion tends to occur at this part.

In the present invention, since the internal stress of the protection insulating film 39 is set to be a compression stress, corrosion and/or disconnection of each pulled-out wiring line 12 can be reduced as described in the following embodiment. It can be considered forming the protection insulating film so that the internal stress of the protection insulating film is the compression stress and increasing a film density can prevent ionic impurities or moisture from entering the unhardened region of the protection insulating film.

Although the transistor array circuit substrate has been described in the foregoing embodiment, the present invention is not restricted thereto and can be applied to any other circuit substrates.

The present invention will now be described in detail with reference to embodiments, but the present invention is not restricted thereto.

Embodiment 1

<Formation of Liquid Crystal Display Panel>

(1) An electroconductive film was formed on a transparent substrate by a vapor growth method, and the electroconductive film was patterned by a photolithography method and an etching method so that gate lines, gates of a plurality of thin film transistors, a plurality of capacitor lines, a plurality of pulled-out wiring lines, gate terminals and others are formed.

(2) A gate insulating film was formed on the entire surface of the substrate by a vapor deposition method to cover the pattern formed at (1).

(3) A channel protection film of the plurality of thin film transistors, an impurity doped semiconductor film, pixel electrodes and others were sequentially formed on the gate insulating film by sequentially carrying out the vapor growth method, the photolithography method and the etching method.

(4) An electroconductive film was formed by the vapor growth method on the channel protection film, the impurity doped semiconductor film, the pixel electrodes and others obtained at (3), and the electroconductive film was patterned by the photolithography method so that a plurality of drain lines, a drain and a source of each of the plurality of thin film transistors, a plurality of pulled-out wiring lines, drain terminals and others are formed.

(5) A protection insulating film was formed on the entire surface of the substrate to cover the pattern formed at (4). The protection insulating film was formed by a plasma CVD method in such a manner that its film thickness becomes 2000 Å. Film formation conditions by the plasma CVD method are as follows.

Silane ($SiH_4$) and ammonia ($NH_3$) were used as reactive gases, and nitrogen ($N_2$) was used as a carrier gas. In regard to a flow quantity of each gas, $SiH_4$ has 170 $cm^3$/min (sccm), NH3 has 170 $cm^3$/min (sccm) and $N_2$ has 2500 $cm^3$/min (sccm) in a standard state (0° C., 101325 Pa). A temperature at the time of film formation was 250° C., and a pressure was 125 Pa.

(6) An additionally formed opposed substrate was attached on the transistor array circuit substrate described in (5) with a sealing material therebetween, and a liquid crystal was sealed between the two substrates.

(7) A contact hole was formed in the gate insulating film and the protection insulating film in a driver attachment region of the transistor array circuit substrate described in (6) so that the gate terminal 42 is exposed, and a contact hole was formed in the protection insulating film in such a manner that the drain terminal is exposed.

(8) An anisotropic electroconductive binding material slightly larger than the driver attachment region described in (7) is attached on this region while considering a dimensional tolerance of the anisotropic electroconductive binding material and an attachment tolerance.

(9) The semiconductor device was mounted on the anisotropic electroconductive binding material described at (8), and positioning was performed in such a manner that each electrode of the semiconductor device is disposed on the contact hole mentioned at (7).

(10) Heat having a relatively low temperature is applied from an upper surface side of the semiconductor device 9 described at (9) to fuse the anisotropic electroconductive binding material, and the semiconductor device is pressed from above and heat having a relatively high temperature (however, a temperature suitable for the semiconductor device) is applied to the semiconductor device by heating and pressing means 50 so that each electrode of the semiconductor device is electrically connected with the gate terminal or the drain terminal through electroconductive particles contained in the anisotropic electroconductive binding material, thereby thermally hardening the anisotropic electroconductive binding material. As a result, thermocompression of the semiconductor device with respect to the transistor array circuit substrate was brought to compression.

Embodiment 2

The same procedure as that in Embodiment 1 was adopted to create a liquid crystal display panel except a point that the pressure condition is changed to 110 Pa in film formation of a protection insulating film by the plasma CVD method.

COMPARATIVE EXAMPLE 1

The same procedure as that in Embodiment 1 was adopted to create a liquid crystal display panel except a point that the pressure condition is changed to 170 Pa in film formation of a protection insulating film by the plasma CVD method.

<Internal Stress Evaluation>

Evaluating an internal stress of a protection insulating film in each of transistor array circuit substrates according to Embodiment 1, Embodiment 2 and Comparative Example 1, −39 MPa was obtained in Embodiment 1, −129 MPa was obtained in Embodiment 2, and 270 MPa was obtained in Comparative Example 1. It is to be noted that a positive value means a tensile stress and a negative value means a compression stress.

<Attachment of Semiconductor Device to Liquid Crystal Display Panel>

A semiconductor device was attached to each of liquid crystal display panels according to Embodiment 1, Embodiment 2 and Comparative Example 1. First, an epoxy-based anisotropic electroconductive binding material was disposed at a position where the semiconductor device of the substrate is fixed. The semiconductor device was mounted on this material so that an electrode is disposed at a position of a contact hole, and the semiconductor device was heated/pressed from above by heating and pressing means 50. As a result, a binder resin in the anisotropic electroconductive binding material was thermally hardened, thereby fixing the semiconductor device on the transistor array circuit substrate.

<Performance Measurement>

Each liquid crystal display panel having the semiconductor device attached thereon was set in an environment where a temperature is 80° C. and humidity is 90%, and the number of occurrences of corrosion per line and the number of disconnections per panel were measured every 15 hours. It is to be noted that the number of wiring lines in each liquid crystal display panel used for evaluation was 384 per panel.

<Results>

Figure 8:
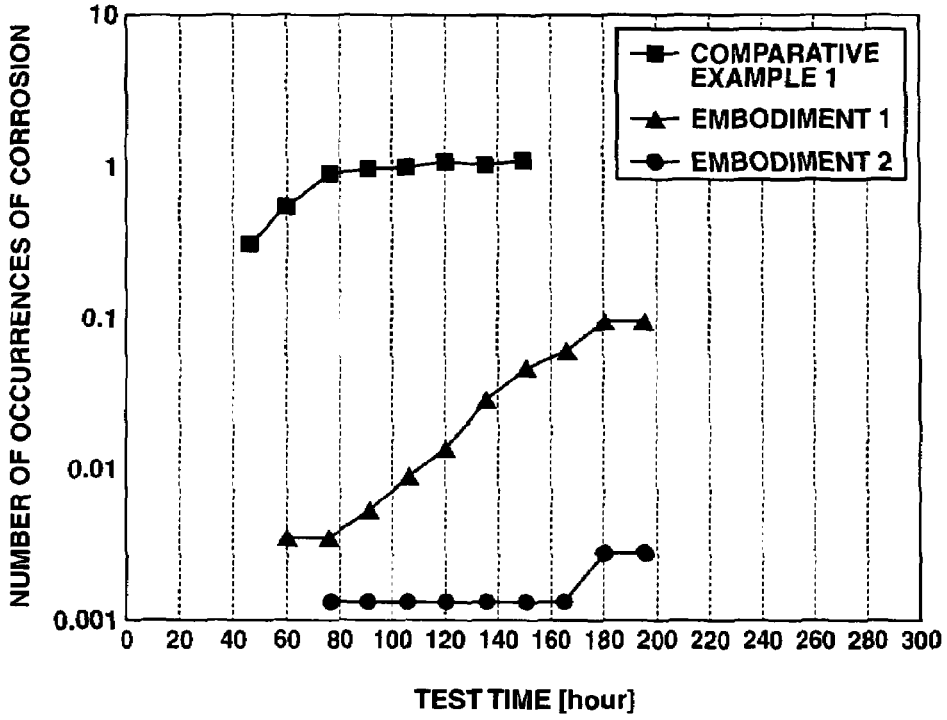
FIG. 8 is a graph showing a relationship between the number of occurrences of corrosion per line and a test time in each of liquid crystal display panels according to Embodiments 1 and 2 and Comparative Example 1.

FIG. 8 is a graph showing a relationship between the number of occurrences of corrosion per line and a test time in each of the liquid crystal display panels according to Embodiments 1 and 2 and Comparative Example 1. In the liquid crystal display panel according to Embodiment 1, 0.003 occurrence of corrosion/line was detected on average after 60 hours. The number of occurrences of corrosion was then gradually increased, and 0.1 occurrence of corrosion/line was detected on average after 195 hours.

In the liquid crystal display panel according to Embodiment 2, 0.0012 occurrence of corrosion/line was detected on average after 75 hours. The number of occurrences of corrosion was then gradually increased, and 0.0025 occurrences of corrosion/line was detected on average after 195 hours.

In the liquid crystal display panel according to Comparative Example 1, 0.003 occurrences of corrosion/line was detected on average after 45 hours. The number of occurrences of corrosion was then gradually increased, and one occurrence of corrosion/line was detected on average after 150 hours.

Figure 9:
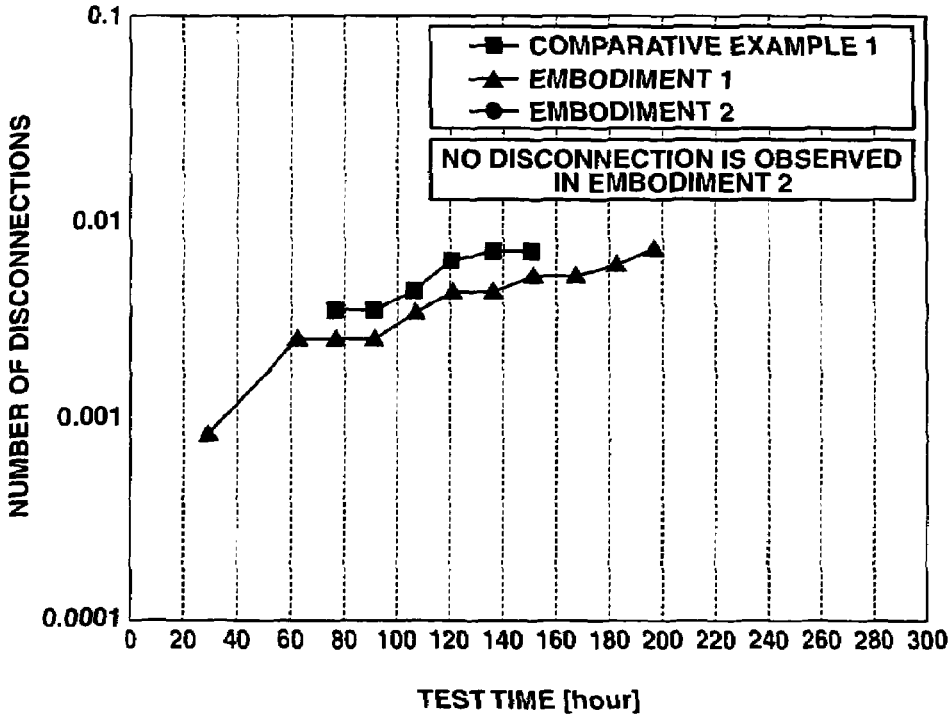
FIG. 9 is a graph showing the number of disconnections per panel and a test time in each of the liquid crystal display panels according to Embodiments 1 and 2 and Comparative Example 1.

FIG. 9 is a graph showing a relationship between the number of disconnections per panel and a test time in each of the liquid crystal display panels according to Embodiments 1 and 2 and Comparative Example 1. In the liquid crystal display panel according to Embodiment 1, 0.0018 disconnection/panel was detected on average after 30 hours, and 0.0024 disconnection/panel was detected on average after 60 hours. The number of disconnections was then gradually increased, 0.005 disconnection/panel was detected on average after 150 hours, and 0.007 disconnection/panel was detected on average after 195 hours.

In the panel according to Embodiment 2, no disconnection was detected.

In the liquid crystal display panel according to Comparative Example 1, 0.0034 disconnection/panel was detected on average after 75 hours. The number of disconnections was then gradually increased, and 0.007 disconnection/panel was detected on average after 150 hours.

As described above, when the internal stress of the protection insulating film is set to be the compression stress of −39 MPa, the corrosion can be reduced, and the disconnection can be also decreased. Further, when the internal stress of the protection insulating film is set to be the compression stress of −129 MPa, the corrosion can be further reduced, and the disconnection can be further decreased.

It is to be noted that the protection insulating film is formed in such a manner that its internal stress is the compression stress in the foregoing embodiments, but any insulating film consisting of a silicon nitride film as well as the protection insulating film may be formed in such a manner that its internal stress becomes the compression stress. Furthermore, the configuration of the part where the semiconductor device is mounted may be the same as that described above in not only the transistor array circuit substrate including the thin film transistor but also a passive matrix type circuit substrate and a display device.

As described above, according to the present invention, the opening portion which is formed on the electroconductive film provided on the substrate and exposes a part of the electroconductive film is provided, and the internal stress is set to be the compression stress. As a result, when the semiconductor device is mounted on the substrate by using the anisotropic electroconductive binding material, the corrosion of the electroconductive film due to an unhardened region of the anisotropic electroconductive film can be reduced, and the disconnection of the wiring lines formed of the electroconductive film can be decreased.

What is claimed is:

1. A mounting structure of a semiconductor device, comprising:

a substrate;

an electroconductive film provided on the substrate;

an insulating film which is formed on the electroconductive film and which is provided with an opening portion to expose a part of the electroconductive film and whose internal stress is set to be a compression stress;

an anisotropic electroconductive binding material which is disposed on the part of the electroconductive film exposed by the opening portion and on the insulating film; and a semiconductor device which has a plurality of electrodes and is disposed on the anisotropic electroconductive binding material, the plurality of electrodes being electrically connected with the electroconductive film through the anisotropic electroconductive binding material.

2. The mounting structure according to claim 1, wherein the anisotropic electroconductive binding material is provided in an entire region where the semiconductor device is mounted, and provided in an outside of the region.

3. The mounting structure according to claim 2, wherein the anisotropic electroconductive binding material outside the region has an unhardened part when the semiconductor device is mounted.

4. The mounting structure according to claim 1, wherein another insulating film in which another opening portion communicating with the opening portion is provided is interposed between the electroconductive film and the insulating film.

5. The mounting structure according to claim 4, wherein an internal stress of another insulating film is set to be a compression stress.

6. The mounting structure according to claim 1, wherein another insulating film in which another opening portion communicating with the opening portion is provided is interposed between the electroconductive film and the insulating film, and the mounting structure includes another electroconductive film formed between the insulating film and another insulating film.

7. The mounting structure according to claim 6, wherein the insulating film and another insulating film are provided in an entire region where the semiconductor device is mounted, and provided in an outside of the region.

8. The mounting structure according to claim 6, wherein the substrate includes a transistor array circuit substrate having a plurality of thin film transistors, and a plurality of gate lines each of which has a gate terminal in the region where the semiconductor device is mounted and is connected with a gate electrode of each of the plurality of thin film transistors or a plurality of drain lines each of which has a drain terminal in the region where the semiconductor device is mounted and is connected with a drain electrode of each of the plurality of thin film transistors are formed of the electroconductive film.

9. The mounting structure according to claim 8, wherein either the plurality of gate lines or the plurality of drain lines which are not formed of the electroconductive film are formed of another electroconductive film.

10. The mounting structure according to claim 8, wherein each of the plurality of electrodes of the semiconductor device is connected with either one of the plurality of gate terminals or one of the plurality of drain terminals therebetween through the anisotropic electroconductive binding material.

11. The mounting structure according to claim 8, wherein the plurality of gate terminals and the plurality of drain terminals are provided on one side of the substrate.

12. The mounting structure according to claim 6, wherein the substrate is a transistor array circuit substrate having a plurality of thin film transistors, and a plurality of gate lines each of which has a gate terminal in the region where the semiconductor device is mounted and is connected with a gate electrode of each of the plurality of thin film transistors are formed of the electroconductive film, and a plurality of drain lines each of which has a drain terminal in the region where the semiconductor device is mounted and is connected with a drain electrode of each of the plurality of thin film transistors are formed of another electroconductive film.

13. A liquid crystal display device comprising:

a pair of substrates;

an electroconductive film provided on one of the pair of substrates;

an insulating film which is formed on the electroconductive film and which is provided with an opening portion to expose a part of the electroconductive film therefrom and whose internal stress is be to serve as a compression stress;

an anisotropic electroconductive binding material which is disposed on the part of the electroconductive film exposed by the opening portion and on the insulating film; and a semiconductor device which has a plurality of electrodes and is disposed on the anisotropic electroconductive binding material, the plurality of electrodes being electrically connected with the electroconductive film through the anisotropic electroconductive binding material.

14. The liquid crystal display device according to claim 13, wherein the anisotropic electroconductive binding material is provided in an entire region where the semiconductor device is mounted, and provided in an outside of the region.

15. The liquid crystal display device according to claim 14, wherein the anisotropic electroconductive binding material outside the region has an unhardened part when the semiconductor device is mounted.

16. The liquid crystal display device according to claim 13, wherein another insulating film in which an opening portion communicating with the opening portion is provided is interposed between the electroconductive film and the insulating film.

17. The liquid crystal display device according to claim 16, wherein an internal stress of another insulating film is set to be a compression stress.

18. The liquid crystal display device according to claim 16, wherein another insulating film in which another opening portion communicating with the opening portion is provided is interposed between the electroconductive film and the insulating film, and the liquid crystal display device includes another electroconductive film formed between the insulating film and another insulating film.

19. The liquid crystal display device according to claim 18, wherein the insulating film and another insulating film are provided in an entire region where the semiconductor device is mounted, and provided in an outside of the region.

20. The liquid crystal display device according to claim 18, wherein one of the substrates includes a transistor array circuit substrate having a plurality of thin film transistors, and a plurality of gate lines each of which has a gate terminal in the region where the semiconductor device is mounted and is connected with a gate electrode of each of the thin film transistors or a plurality of drain lines each of which has a drain terminal in the region where the semiconductor device is mounted and is connected with a drain electrode of each of the thin film transistors are formed of the electroconductive film.

21. The liquid crystal display device according to claim 20, wherein either the plurality of gate lines or the plurality of drain lines which are not formed of the electroconductive film are formed of another electroconductive film.

22. The liquid crystal display device according to claim 20, wherein each of the plurality of electrodes of the semiconductor device is connected with either one of the plurality of gate terminals or one of the plurality of drain terminals therebetween through the anisotropic electroconductive binding material.

23. The liquid crystal display device according to claim 20, wherein the plurality of gate terminals and the plurality of drain terminals are provided on one side of one of the substrates.

24. The liquid crystal display device according to claim 18, wherein one of the substrates inlcudes a transistor array circuit substrate having a plurality of thin film transistors, and a plurality of gate lines each of which has a gate terminal in the region where the semiconductor device is mounted and is connected with a gate electrode of each of the plurality of thin film transistors are formed of the electroconductive film, and a plurality of drain lines each of which has a drain terminal in the region where the semiconductor device is mounted and is connected with a drain electrode of each the plurality of thin film transistors are formed of another electroconductive film.

*25. A liquid crystal display device comprising:*

*a pair of substrates;*

*at least one electroconductive film provided on one side of a surface of one of the pair of substrates;*

*an insulating film which is formed on the electroconductive film and which is provided with an opening exposing a part of the electroconductive film and whose internal stress is set to be a compression stress;*

*an anisotropic electroconductive binding material which is disposed on a side of a surface of the part of the electroconductive film exposed by the opening and on the insulating film; and*

*a semiconductor device which has a plurality of electrodes and is disposed on the anisotropic electroconductive binding material, one of the plurality of electrodes being electrically connected with the electroconductive film through the anisotropic electroconductive binding material.*

*26. The liquid crystal display device according to claim 25, wherein the anisotropic electroconductive binding material is*

*provided in an entire region where the semiconductor device is mounted, and is provided outside of the region, and the anisotropic electroconductive binding material outside of the region has an unhardened part when the semiconductor device is mounted.*

*27. The liquid crystal display device according to claim 25, wherein another electroconductive film is interposed between said one of the pair of substrates and the electroconductive film, and another insulating film is interposed between the electroconductive film and another electroconductive film.*

*28. The liquid crystal display device according to claim 27, wherein said another insulating film is provided with another opening exposing a part of said another electroconductive film.*

*29. The liquid crystal display device according to claim 25, wherein another electroconductive film is interposed between the substrate and the electroconductive film, a plurality of thin film transistors are arranged on said one side of the surface of said one of the pair of substrates, and one of (i) a gate line or a first pulled-out wiring line which is electrically connected with a gate terminal in a region where the semiconductor device is mounted and gate electrodes of the plurality of thin film transistors and (ii) a drain line or a second pulled-out wiring line which is electrically connected with a drain terminal in the region where the semiconductor device is mounted and drain electrodes of the plurality of thin film transistors, which is not formed of the electroconductive film is formed of said another electroconductive film.*

*30. The liquid crystal display device according to claim 25, wherein a plurality of electroconductive films are provided, a plurality of thin film transistors are arranged on said one side of the surface of said one of the pair of substrates, and one of (i) a plurality of gate lines or a plurality of first pulled-out wiring lines which are electrically connected with gate terminals in a region where the semiconductor device is mounted and gate electrodes of the plurality of thin film transistors and (ii) a plurality of drain lines or a plurality of second pulled-out wiring lines which are electrically connected with drain terminals in the region where the semiconductor device is mounted and drain electrodes of the plurality of thin film transistors, are formed of the electroconductive films.*

*31. The liquid crystal display device according to claim 30, wherein further electroconductive films are interposed between said one of the pair of substrates and the electroconductive films, and wherein the plurality of gate lines are formed of said further electroconductive films, and the plurality of drain lines are formed of the electroconductive films.*

*32. The liquid crystal display device according to claim 30, wherein further electroconductive films are interposed between said one of the pair of substrates and the electroconductive films, and wherein the plurality of first pulled-out wiring lines are formed of said further electroconductive films, and the plurality of second pulled-out wiring lines are formed of the electroconductive films.*

*33. A liquid crystal display device of a semiconductor device comprising:*

*a pair of substrates;*

*at least one electroconductive layer provided on one side of one of the pair of substrates;*

*an insulating layer which is formed on the electroconductive layer and which is provided with an opening exposing a part of said electroconductive layer and which includes a first insulating film and a second insulating film whose internal stresses are set to be compression stresses;*

*an anisotropic electroconductive binding material which is disposed on one side of the part of the electroconductive layer exposed by the opening and on the insulating layer; and*

*a semiconductor device which has a plurality of electrodes and is disposed on the anisotropic electroconductive binding material, one of the plurality of the electrodes being electrically connected with the electroconductive layer through the anisotropic electroconductive binding material.*

*34. The liquid crystal display device according to claim 33, wherein the anisotropic electroconductive binding material is provided in an entire region where the semiconductor device is mounted, and is provided outside of the region, and the anisotropic electroconductive binding material outside of the region has an unhardened part when the semiconductor device is mounted.*

*35. The liquid crystal display device according to claim 33, wherein another electroconductive layer is interposed between the first insulating film and the second insulating film.*

*36. The liquid crystal display device according to claim 35, wherein one of the first insulating film and the second insulating film is provided with another opening exposing a part of said another electroconductive layer.*

*37. The liquid crystal display device according to claim 33, wherein another electroconductive layer is interposed between the first insulating film and the second insulating film, a plurality of thin film transistors are arranged on said one side of the surface of said one of the pair of substrates, and one of (i) a gate line or a first pulled-out wiring line which is electrically connected with a gate terminal in a region where the semiconductor device is mounted and gate electrodes of the plurality of thin film transistors and (ii) a drain line or a second pulled-out wiring line which is electrically connected with a drain terminal in the region where the semiconductor device is mounted and drain electrodes of the plurality of thin film transistors, which is not formed of the electroconductive layer is formed of said another electroconductive layer.*

*38. The liquid crystal display device according to claim 33, wherein a plurality of electroconductive layers are provided, a plurality of thin film transistors are arranged on said one side of the surface of said one of the pair of substrates, and one of (i) a plurality of gate lines or a plurality of first pulled-out wiring lines which are electrically connected with gate terminals in a region where the semiconductor device is mounted and gate electrodes of the plurality of thin film transistors and (ii) a plurality of drain lines or a plurality of second pulled-out wiring lines which are electrically connected with drain terminals in the region where the semiconductor device is mounted and drain electrode of the plurality of thin film transistors, are formed of the electroconductive layers.*

*39. The liquid crystal display device according to claim 38, wherein further electroconductive layers are interposed between the first insulating film and the second insulating film, and wherein the plurality of gate lines are formed of the electroconductive layers, and the plurality of drain lines are formed of said further electroconductive layers.*

*40. The liquid crystal display device according to claim 38, wherein further electroconductive layers are interposed between the first insulating film and the second insulating film, and wherein the plurality of first pulled-out lines are formed of the electroconductive layers, and the plurality of second pulled-out lines are formed of said further electroconductive layers.*

*41. A mounting structure comprising:*

*a substrate;*

*at least one electroconductive film provided on one side of a surface of the substrate;*

*an insulating film which is formed on the electroconductive film and which is provided with an opening exposing a part of the electroconductive film and whose internal stress is set to be a compression stress;*

*an anisotropic electroconductive binding material which is provided on one side of the part of the electroconductive film exposed by the opening and on the insulating film; and*

*a semiconductor device which has a plurality of electrodes and is disposed on the anisotropic electroconductive binding material, one of the plurality of electrodes being electrically connected with the electroconductive film through the anisotropic electroconductive binding material.*

*42. The mounting structure according to claim 41, wherein the anisotropic electroconductive binding material is provided in an entire region where the semiconductor device is mounted, and is provided outside of the region, and the anisotropic electroconductive binding material outside of the region has an unhardened part when the semiconductor device is mounted.*

*43. The mounting structure according to claim 41, wherein another electroconductive film is interposed between the substrate and the electroconductive film, and another insulating film is interposed between the electroconductive film and said another electroconductive film.*

*44. The mounting structure according to claim 41, wherein a plurality of electroconductive films are provided, a plurality of thin film transistors are arranged on said one side of the surface of the substrate, and one of (i) a plurality of gate lines or a plurality of first pulled-out wiring lines which are electrically connected with gate terminals provided in a region where the semiconductor device is mounted and gate electrodes of the thin film transistors and (ii) a plurality of drain lines or a plurality of second pulled-out wiring lines which are electrically connected with drain terminals in the region where the semiconductor device is mounted and drain electrodes of the thin film transistors, are formed of the electroconductive films.*

*45. A mounting structure comprising:*

*a substrate;*

*an electroconductive layer provided on one side of the substrate;*

*an insulating layer which is formed on the electroconductive layer and which is provided with an opening exposing a part of the electroconductive layer and which includes a first insulating film and a second insulating film whose internal stresses are set to be compression stresses;*

*an anisotropic electroconductive binding material which is disposed above the part of the electroconductive layer exposed by the opening and on the insulating layer; and*

*a semiconductor device which has a plurality of electrodes and is disposed on the anisotropic electroconductive binding material, one of the plurality of electrodes being electrically connected with the electroconductive layer through the anisotropic electroconductive binding material.*

*46. The mounting structure according to claim 45, wherein the anisotropic electroconductive binding material is provided in an entire region where the semiconductor device is mounted, and is provided outside of the region, and the anisotropic electroconductive binding material outside of the region has an unhardened part when the semiconductor device is mounted.*

*47. The mounting structure according to claim 45, wherein another electroconductive layer is interposed between the first insulating film and the second insulating film.*

*48. The mounting structure according to claim 45, wherein a plurality of electroconductive layers are provided, a plurality of thin film transistors are arranged on the substrate, and one of (i) a plurality of gate lines or a plurality of first pulled-out wiring lines which are electrically connected with gate terminals provided in a region where the semiconductor device is mounted and gate electrodes of the thin film transistors and (ii) a plurality of drain lines or a plurality of second pulled-out wiring lines which are electrically connected with drain terminals in the region where the semiconductor device is mounted and drain electrodes of the thin film transistors, are formed of the electroconductive films.*

* * * * *